United States Patent [19]

Leake et al.

[11] Patent Number: 4,864,218

[45] Date of Patent: Sep. 5, 1989

[54] METHOD OF COMPENSATING FOR FREQUENCY ERRORS IN NOISE POWER METERS

[75] Inventors: Bernard W. Leake, Beaverton; Andrew C. Davidson, Portland, both of Oreg.

[73] Assignee: Cascade Microtech, Inc., Beaverton, Oreg.

[21] Appl. No.: 269,970

[22] Filed: Nov. 9, 1988

[51] Int. Cl.$^4$ .............................. G01S 7/40; H04B 1/16
[52] U.S. Cl. .................................. 324/57 N; 455/226
[58] Field of Search ............... 455/135, 226, 255, 302; 324/57 N, 57 SS, 57 R

[56] References Cited

U.S. PATENT DOCUMENTS

| | | | |
|---|---|---|---|
| 3,936,753 | 2/1976 | Clark | 455/302 |
| 4,232,398 | 11/1980 | Gould | 455/226 |
| 4,491,783 | 1/1985 | Sawayama | 324/57 N |
| 4,685,150 | 8/1987 | Maier | 455/226 |
| 4,714,873 | 12/1987 | McPherson | 324/57 N |

FOREIGN PATENT DOCUMENTS 1327023  7/1987  U.S.S.R. ............ 324/57 N

OTHER PUBLICATIONS

Kuhn; "Accurate and Automatic Noise Figure Measurements with Standard Equipment"-Intnl. MW Symposium-May 1980-(pp. 425-427).

Primary Examiner—Reinhard J. Eisenzopf
Assistant Examiner—Jose M. Solis
Attorney, Agent, or Firm—Chernoff, Vilhauer, McClung & Stenzel

[57] ABSTRACT

A method of measuring and compensating for measurement frequency inaccuracies encountered when measuring noise power of a device under test within a desired calibrating frequency range. The method includes sweeping a frequency synthesizer through a frequency range which includes the desired measurement frequency range. Power is measured for different synthesizer frequencies with the noise power meter set to the desired frequency range. Alternatively, the frequency synthesizer may be set to the desired measurement frequency and the noise power meter swept through a range including the desired measurement frequency. The resulting power measurements show the frequency range within which the noise power meter actually measured power. The difference between the desired measurement frequency range and the actual measurement frequency range is the measurement frequency error which may be corrected using a frequency conversion stage to displace test signals by the amount of the measurement frequency error before they are sent to the noise power meter.

1 Claim, 3 Drawing Sheets

METHOD OF COMPENSATING FOR FREQUENCY ERRORS IN NOISE POWER METERS

BACKGROUND OF THE INVENTION

The present invention relates to measuring noise power within a narrow frequency range. More particularly, the invention concerns measuring and compensating for inaccuracies in the measurement frequency used by a noise power meter.

Accurate calculations of a device under test's (DUT's) noise parameters require noise power measurements to be taken at the frequency at which its scattering parameters were measured. Conventionally, noise power meters measure "spot noise power," that is, noise power contained within a relatively narrow frequency range. The center of this frequency range is called the "measurement frequency." A noise power meter typically isolates signals within the narrow frequency range using a variable frequency conversion stage followed by a fixed narrow passband filter. The variable frequency conversion stage shifts the frequency of the measured signal by a selected amount so that it lies within the narrow passband of the bandpass filter. The noise power meter measures the power of the signal at the bandpass filter's output.

Any inaccuracy in the variable frequency conversion stage or in the bandpass filter results in a corresponding error in the measurement frequency. These errors can be eliminated if the noise power meter's variable frequency conversion stage uses an accurate frequency synthesizer as its local oscillator and the bandpass filter is perfectly centered on the desired measurement frequency. However, conventional noise power meters use imperfect bandpass filters and less expensive oscillators instead of frequency synthesizers, with corresponding frequency inaccuracies.

Inaccuracies in the measurement frequency can become significant when the DUT has a gain or noise power which changes dramatically with its connected source admittance. Since the source admittance presented to the DUT varies rapidly with the measurement frequency (see Larock and Meys, "Automatic Noise Temperature Measurement Through Frequency Variation," *IEEE Transactions on Microwave Theory and Techniques*, Vol. MTT-30, No. 8, August 1982.), an error in the measurement frequency changes the source admittance, which in turn changes the DUT's gain. These changes in the DUT's gain cause the measured noise power to be substantially different from the DUT's noise power at the desired measurement frequency.

What is needed, then, is a method of measuring and compensating for inaccuracies in the measurement frequency of noise power meters, allowing a DUT's noise power to be measured at the frequency at which its scattering parameters were measured.

SUMMARY OF THE INVENTION

The present invention provides a method of measuring and compensating for measurement frequency inaccuracies, thus overcoming the above-mentioned shortcomings and drawbacks of measuring spot noise power with a noise power meter having an inaccurate frequency base.

In accordance with the present invention, a highly accurate frequency synthesizer is used to determine the noise power meter's gain as a function of the input signal frequency, which allows the measurement frequency error to be determined. Any frequency conversion stage then may be used to shift the input signal's frequency by an amount necessary to compensate for the determined measurement frequency error.

It is therefore a principal object of the present invention to allow a device's noise power measurements to be taken at the same frequency at which its scattering parameters are measured.

It is another principal object of the present invention to provide a convenient method of measuring and compensating for measurement frequency inaccuracies in noise power meters.

The foregoing and other objectives, features, and advantages of the present invention will be more readily understood upon consideration of the following detailed description of the invention taken in conjunction with the accompanying drawings.

DETAILED DESCRIPTION OF THE INVENTION

Figure 1:
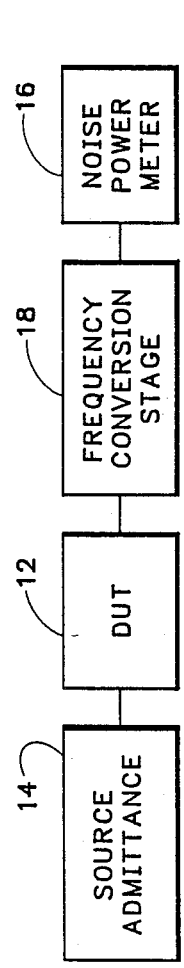
FIG. 1 is a block diagram of a typical noise measurement system.

Referring to FIG. 1, a block diagram of a typical noise measurement system 10 is shown. The input of a device under test (DUT) 12 is connected to a source admittance 14. The DUT's output is connected to a noise power meter 16. ("Noise power meter" is used herein to include both noise power meters and noise figure meters which include a tunable down-converter and a narrow passband filter.) The noise power meter 16 measures power within a narrow frequency range centered on the measurement frequency. An external frequency conversion stage 18 may be necessary to extend the measured frequency range beyond the measurement frequency limits of the noise power meter 16.

Figure 2:
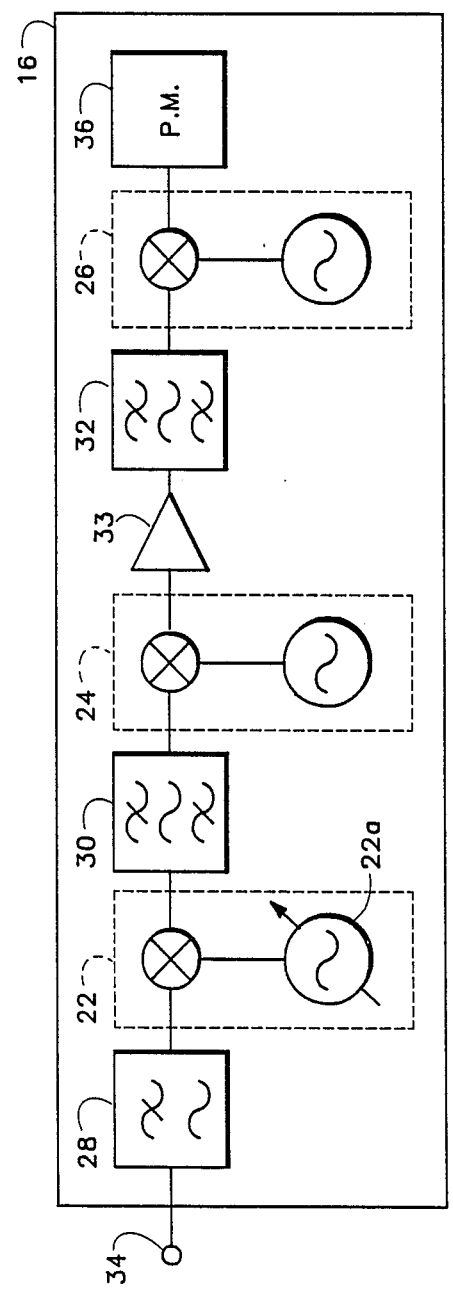
FIG. 2 is a block diagram of a typical noise power meter's internal circuitry.

A block diagram of the noise power meter 16 is shown in FIG. 2. The meter 16 comprises several frequency conversion stages 22, 24, and 26, several filters 28, 30, and 32, and an amplifier 33. The frequency conversion stages, filters and amplifier isolate and amplify a selected narrow frequency range of the input signal before sending it to a power meter 36. The first frequency conversion stage 22 is variable, shifting the input signal frequency of interest to within the fixed passband of the second filter 30. The second and third frequency conversion stages 24 and 26 are fixed, as is the third bandpass filter 32.

Assume a broadband signal is present at the input 34. The first frequency conversion stage 22 determines the input signal frequency which is passed by the fixed passband of the second filter 30. An error in the frequency shift causes a corresponding error in the measurement frequency.

Figure 3:
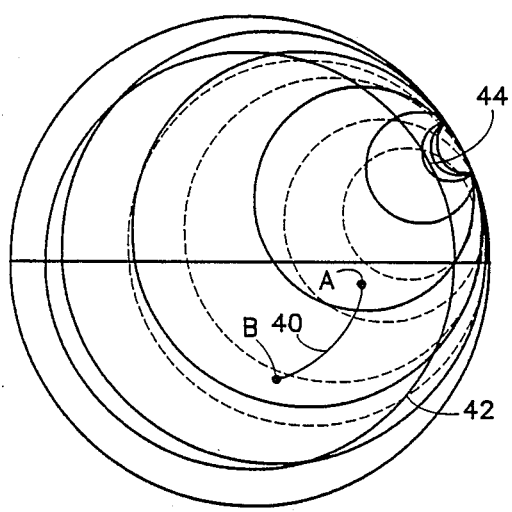
FIG. 3 is a Smith chart showing constant gain circles and constant noise figure circles for a hypothetical device under test.

Many DUTs 12 (FIG. 1) have gains or noise figures which change dramatically with a change in their connected source admittance. A Smith chart showing constant gain circles (solid lines) and constant noise figure circles (dashed lines) for such a device is shown in FIG. 3. For an unmatched source admittance, the phase of the reflection coefficient presented to the DUT 12 typically varies with the measurement frequency while the reflection coefficient's magnitude remains almost constant. For example, an increase in measurement frequency can cause the source reflection coefficient to move from point A to point B along line 40. Line 40 is an arc of a circle whose center is the center of the Smith chart A sufficiently large change in measurement frequency can cause the source reflection coefficient to move through a complete circle, as shown by circle 42 for a larger source mismatch. Although an intentional shift in measurement frequency can be useful, for example, yielding different source admittance measurement points (see Larock and Meys, mentioned above), an unintentional frequency shift can cause equally drastic changes in the source admittance, and thus errors in the measured noise power.

Figure 4:
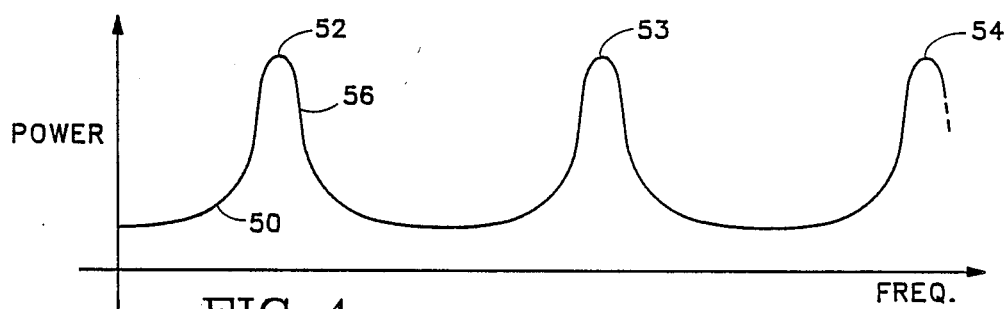
FIG. 4 is a graph of noise power as a function of measurement frequency for the device under test represented in FIG. 3 when terminated with a non-matched source admittance.

A graph of measured noise power as a function of the measurement frequency is shown in FIG. 4. The line 50 represents the measured noise power as the source reflection coefficient moves along the circle 42 (FIG. 3). The peaks 52–54 represent the measured noise power as the source reflection coefficient moves through the high gain region 44 (FIG. 3). Since sufficient change in the measurement frequency causes a 360-degree change in the reflection coefficient phase, the graph of FIG. 4 is periodic. The steepness of the line 50 at location 56 shows the need for high accuracy of the measurement frequency; a small error in the measurement frequency can cause a large error in the measured noise power.

Figure 5:
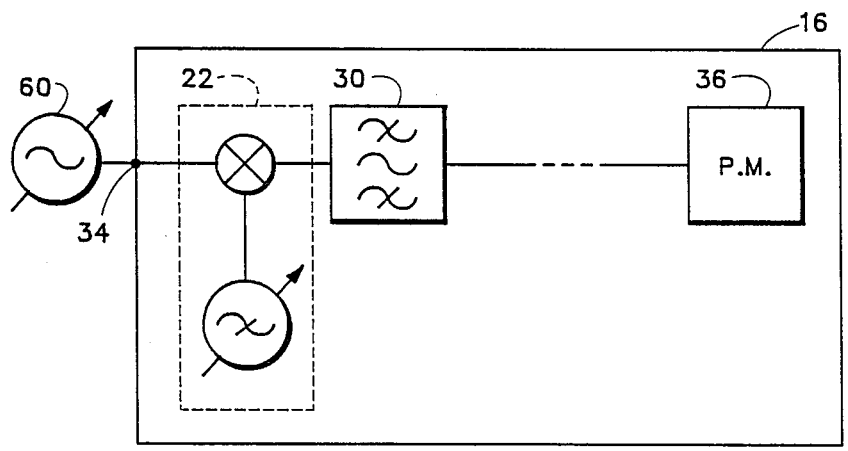
FIG. 5 is a block diagram of an exemplary system for determining inaccuracies in the measurement frequency according to the present invention.

Referring now to FIG. 5, to determine the error in the measurement frequency, a highly accurate frequency synthesizer 60 is connected to the input 34 of the noise power meter 16 and is set to the desired measurement frequency. The noise power meter 16 is instructed to measure power at each of a range of selected measurement frequencies, where the range includes the desired measurement frequency. For example, assume the desired measurement frequency is 700 MHz. Also, assume the noise power meter 16 measures power within a 4 MHz measurement frequency range and may be located with a 1 MHz resolution. The synthesizer 60 is set to 700 Mhz. The noise power meter is instructed to measure power at measurement frequencies of 690 MHz to 710 MHz in 1 MHz steps.

Figure 6:
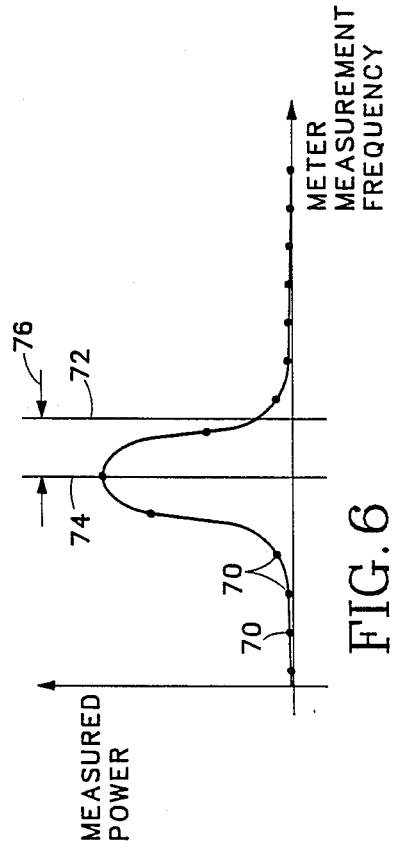
FIG. 6 is a graph of measured power as a function of a noise power meter measurement frequency with a fixed input frequency.

Referring now to FIG. 6, the measured powers may be plotted on a graph where the horizontal axis represents the offset from the desired measurement frequency and the vertical axis represents the measured power. The points 70 represent the measured power at the various measurement frequencies and the vertical line 72 represents the desired measurement frequency. From this graph, the input signal frequency range which has the greatest effect on measured power can be determined. Thus the actual measurement frequency 74 and the corresponding measurement frequency error 76 may be determined.

Using another method, the measurement frequency error may be determined by setting the measurement frequency of the noise power meter 16 to the desired measurement frequency. The frequency synthesizer 60 is then swept through a range of frequencies which includes the desired measurement frequency. The noise figure meter is instructed to measure power for a plurality of the swept frequencies. Since the frequency synthesizer has much higher frequency resolution than the noise power meter, more measurements may be taken within a fixed frequency range than are possible by sweeping the measurement frequency of the noise power meter. For example, assume the desired measurement frequency is 700 MHz and the noise power meter 16 measures power within a 4 MHz measurement frequency range. The noise power meter is set to measure power at 700 MHz. The frequency synthesizer 60 is set to sweep through a plurality of frequencies from 690 MHz to 710 MHz in steps which can be as small as 1 or 2 Hz.

Figure 7:
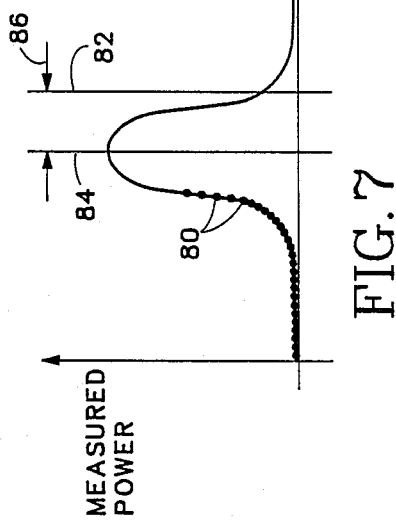
FIG. 7 is a graph of measured power as a function of input frequency with a fixed noise power meter measurement frequency.

Referring now to FIG. 7, the measured powers may be plotted on a graph where the horizontal axis represents the frequency of the frequency synthesizer and the vertical axis represents the measured power. The points 80 represent the measured power at the various frequencies and the vertical line 82 represents the desired measurement frequency. From this graph, the input signal frequency range which has the greatest effect on measured power can be determined. The difference between this frequency, which is the actual measurement frequency 84, and the measurement frequency 86 set on the noise power meter 16 is the measurement frequency error.

There are alternative methods for determining the actual measurement frequency 84. One method is to determine the two synthesizer frequencies at which the measured powers are 10 dB down from the maximum measured power. Assuming the response of the bandpass filter following the noise power meter's frequency conversion stage is symmetrical, then the actual measurement frequency 84 is the average of these two "edge" frequencies. If no measured power is exactly 10 dB down from the maximum measured power, then the edge frequencies may be determined by interpolation. A second method is to integrate the measured power as a function of the synthesizer frequency and set the actual measurement frequency 84 to the intermediate frequency which has equal areas on each side. Yet another method sets the actual measurement frequency 84 to the synthesizer frequency at which the maximum power was measured.

Figure 8:
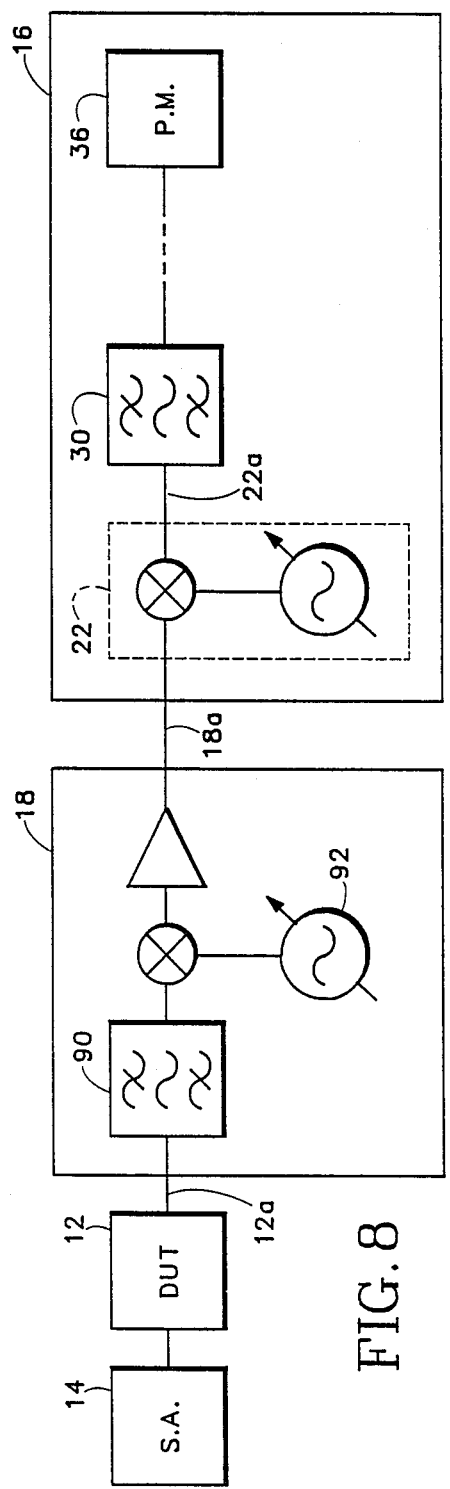
FIG. 8 is a block diagram of the frequency compensated power meter of the invention.

Once the error in the measurement frequency has been determined, it may be compensated for in the measurement of the DUT. Referring to FIG. 8, the DUT 12 is shown connected to the noise power meter 16 via a frequency conversion stage 18. For convenience, the frequency of the signal at the DUT's output 12a will be named "RF." Likewise the frequencies of the signals present at the frequency converter output 18a and the first conversion stage output 22a will be named "IF1" and IF2," respectively, An IF1 is chosen which is suitable for the desired RF sweep. The noise figure meter's measurement frequency is set to IF1, ignoring its known error. (This error would be different for each different value of IF1.) The noise power meter is told to measure either the upper or lower sideband so that it can properly set the preselector 90. The frequency LO1 of the external local oscillator 92 is then set to

LO1=(IF1±ERROR), where ERROR is the measurement frequency error. The ERROR is either added or subtracted depending on which sideband is being measured.

One skilled in the art will appreciate that any frequency conversion stage, either external to, or included within, a noise power meter may be used to compensate for measurement frequency errors. Thus, the oscillator 22a (FIG. 2) may be adjusted to compensate for its own errors. However, due to the low adjustment resolution of the oscillator 22a relative to the measurement error, a frequency synthesizer with more resolution may be preferred.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. A method of measuring and compensating for errors in the measurement frequency of a noise power meter when measuring noise power of a device under test, comprising the steps of:
    (a) setting said noise power meter to measure power at said measurement frequency;
    (b) sequentially sending signals having substantially identical powers and different frequencies to said noise power meter;
    (c) measuring with said noise power meter a respective measured power for each one of said different frequencies;
    (d) determining a center frequency corresponding to the center of a range of signal frequencies, said signals of step (b) within said range of signal frequencies yielding said respective measured powers greater than a selected threshold;
    (e) determining a difference in frequency between said desired measurement frequency and said center frequency;
    (f) frequency shifting output signals from said device under test by said difference in frequency determined in step (e), yielding shifted signals; and
    (g) sending said shifted signals to said noise power meter.

* * * * *

UNITED STATES PATENT AND TRADEMARK OFFICE
CERTIFICATE OF CORRECTION

PATENT NO. : 4,864,218

DATED : September 5, 1989

INVENTOR(S) : Bernard W. Leake et al.

It is certified that error appears in the above-identified patent and that said Letters Patent is hereby corrected as shown below:

Title Page
Abstract, line 5   Delete "calibrating";

Col. 4,   line 66   Change comma (,) after "respectively" to a period (.)

Signed and Sealed this

Eleventh Day of June, 1991

Attest:

HARRY F. MANBECK, JR.

Attesting Officer   Commissioner of Patents and Trademarks